(12) United States Patent
Shin et al.

(10) Patent No.: US 10,638,074 B1
(45) Date of Patent: Apr. 28, 2020

(54) HIGH-SPEED DATA READOUT APPARATUS AND CMOS IMAGE SENSOR USING THE SAME

(71) Applicant: SK hynix Inc., Icheon-si (KR)

(72) Inventors: Min-Seok Shin, Yongin-si (KR); Hoe-Sam Jeong, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/237,257

(22) Filed: Dec. 31, 2018

(30) Foreign Application Priority Data

Sep. 19, 2018 (KR) .................. 10-2018-0112268

(51) Int. Cl.
| | | |
|---|---|---|
| *H04N 5/3745* | (2011.01) | |
| *G11C 7/22* | (2006.01) | |
| *H04N 5/378* | (2011.01) | |
| *H04N 5/357* | (2011.01) | |
| *H04N 5/355* | (2011.01) | |

(52) U.S. Cl.
CPC .......... *H04N 5/3745* (2013.01); *G11C 7/222* (2013.01); *H04N 5/355* (2013.01); *H04N 5/3575* (2013.01); *H04N 5/378* (2013.01)

(58) Field of Classification Search
CPC ...... H04N 5/355; H04N 5/3745; H04N 5/378; H04N 5/3575; G11C 7/222
See application file for complete search history.

(56) References Cited

U.S. PATENT DOCUMENTS

| | | | | |
|---|---|---|---|---|
| 7,659,925 | B2* | 2/2010 | Krymski | H04N 5/32 250/208.1 |
| 8,089,541 | B2* | 1/2012 | Oike | H03M 1/1023 348/294 |
| 8,576,979 | B2* | 11/2013 | Mo | H04N 5/355 377/108 |
| 9,509,925 | B2* | 11/2016 | Choo | H04N 5/3355 |
| 9,509,932 | B2* | 11/2016 | Park | H04N 5/378 |
| 2018/0350429 | A1* | 12/2018 | Jeong | G11C 11/413 |

FOREIGN PATENT DOCUMENTS

| | | |
|---|---|---|
| KR | 10-2007-0057467 A | 6/2007 |
| KR | 10-0887238 B1 | 3/2009 |

* cited by examiner

*Primary Examiner* — Vanthu T Nguyen
(74) *Attorney, Agent, or Firm* — Perkins Coie LLP

(57) ABSTRACT

A data readout apparatus may include a comparison circuit structured to compare a pixel signal with the ramp signal to generate a comparison result, a counter array structured to receive the comparison results to count up with each clock pulse from a first timing until a second timing to convert a counted number of clock pulses into differential data and output the differential data through differential data lines, and a sense amplifier array structured to receive the differential data to sense and amplify the differential data based on a judge clock. The sense amplifier array can include a replica delay structured to delay the judge clock and the precharge pulse signal based on a read out timing and read out the data from the counter array at the read out timing.

18 Claims, 6 Drawing Sheets

HIGH-SPEED DATA READOUT APPARATUS AND CMOS IMAGE SENSOR USING THE SAME

CROSS-REFERENCE TO RELATED APPLICATION

This patent document claims the priority to and benefits of Korean Patent Application No. 10-2018-0112268 filed on Sep. 19, 2018, which is incorporated herein by reference in its entirety.

TECHNICAL FIELD

The technology and implementations disclosed in this patent document relate to a data readout apparatus and image sensors.

BACKGROUND

Image sensors use photosensing pixels to capture images and can be implemented as complementary metal oxide semiconductor (CMOS) image sensor (CIS) devices. It is desirable to design image sensor in ways to achieve certain device features, including, for example, high-speed readout, low power consumption, low noise level, and others.

SUMMARY

This patent document provides, among others, designs of high-speed data readout apparatus for increasing a noise margin of a sensing amplifier by using a replica delay. This patent document also provides image sensing devices that includes SRAM based counters. The image sensing devices utilizes a high-speed data readout scheme for increasing a noise margin of a sensing amplifier by using a replica delay.

In an embodiment, a data readout apparatus can include a comparison circuit, including an input port to receive an input signal and another input port to receive a ramp signal, structured to compare the input signal with the ramp signal to generate a comparison result; a counter array, including memories arranged based on each column address, structured to operate based on a word line enable signal, the counter array being coupled to the comparison circuit to receive the comparison results to count up with each clock pulse from a first timing determined in response to the word line enable signal until a second timing when the comparison result is changed to convert a counted number of clock pulses into differential data and output the differential data through differential data lines; and a sense amplifier array coupled to the differential data lines to reset the differential data lines based on a precharge pulse signal and to receive the differential data to sense and amplify the differential data based on a judge clock, the sense amplifier array including a replica delay structured to delay the judge clock and the precharge pulse signal based on a read out timing and read out the data from the counter array at the read out timing.

In an embodiment, a data readout apparatus can include a comparison circuit, including an input port to receive a pixel signal and another input port to receive a ramp signal, structured to compare the pixel signal with the ramp signal to generate a comparison result; a counter array, including memories arranged based on each column address, and structured to operate based on a word line enable signal, the counter array being coupled to the comparison circuit to receive the comparison results to count up with each clock pulse from a first timing determined in response to the word line enable signal until a second timing when the comparison result is changed to convert a counted number of clock pulses into differential data and output the differential data through differential data lines; and a sense amplifier array coupled to the differential data lines to reset the differential data lines based on a precharge pulse signal and to receive the differential data to sense and amplify the differential data based on a judge clock, the sense amplifier array including a replica delay structured to delay the judge clock and the precharge pulse signal based on a read out timing and read out the data from the counter array at the read out timing.

By the way of example but not limitation, the sense amplifier array can include an address sampler to receive a column address and a column clock applied from a digital timing generator, the address sampler sampling the column address and transferring the sampled column address to the counter array; a precharge pulse generator to receive the column clock applied from the digital timing generator and generate the precharge pulse signal; an inverter to invert the precharge pulse signal generated by the precharge pulse generator to transfer the inverted precharge pulse signal as the word line enable signal to the counter array; and a sense amplifier and precharge driver to receive the judge clock and the precharge pulse signal delayed by the replica delay to sense and amplify the differential data signals inputted from the counter array, the sense amplifier and precharge driver being structured to reset differential data lines. The replica delay is structured to receive the precharge pulse signal generated by the precharge pulse generator to delay the judge clock and the precharge pulse signal in consideration of the time it takes to ramp up the word line enable signal to a desired high level.

The counter array can include a plurality of address decoders to recognize which column is to be selected based on a column address received from the sense amplifier array; a plurality of logic gates to bypass, based on a signal sent from the corresponding address decoder, the word line enable signal received from the sense amplifier array; and a plurality of registers each including an SRAM as a latch, the SRAM operating based on the word line enable signal provided from the logic gates.

For example, the address decoder, the logic gate, and the register can be provided for each column. The memories may include SRAMs to form an SRAM-based global counter. The replica delay can include a plurality of delay lines to delay the judge clock and the precharge pulse signal by different delay amounts.

In another embodiment, an image sensor can include a pixel array including imaging pixels for sensing incident light to output pixel signals corresponding to the incident light; a row decoder to select and control the imaging pixels within the pixel array at each row line; a data readout apparatus to read out the pixel signals outputted from the pixel array and output data signals; and a control circuit to control the operations of the row decoder and the data readout apparatus. The data readout apparatus includes a comparison circuit including an input port to receive a pixel signal and another input port to receive a ramp signal to compare the pixel signal with the ramp signal with and generate a comparison result; a counter array including memories arranged based on each column address and structured to operate based on a word line enable signal, the counter array being coupled to the comparison circuit to receive the comparison results to count up with each clock pulse from a first timing determined in response to the word line enable signal until a second timing when the comparison result is changed to convert a counted number of clock pulses into the data signals; and a sense amplifier array coupled to the differential data lines to reset the differential data lines based on a precharge pulse signal and to receive the differential data to sense and amplify the differential data based on a judge clock the sense amplifier array including a replica delay structured to delay the judge clock and the precharge pulse signal based on a read out timing and read out the data from the counter array at the read out timing.

By the way of example but not limitation, the sense amplifier array can include an address sampler to receive a column address and a column clock applied from a digital timing generator, the address sampler sampling the column address and transferring the sampled column address to the counter array; a precharge pulse generator to receive the column clock applied from the digital timing generator and generating a precharge pulse signal; an inverter to invert the precharge pulse signal generated by the precharge pulse generator to transfer the inverted precharge pulse signal as the word line enable signal to the counter array; and a sense amplifier and precharge driver to receive the judge clock and the precharge pulse signal delayed by the replica delay to sense and amplify differential data signals inputted from the counter array, the sense amplifier and precharge driver being structured to reset differential data lines. The replica delay is structured to receive the precharge pulse signal generated by the precharge pulse generator to delay the judge clock and the precharge pulse signal in consideration of the time it takes to ramp up the word line enable signal to a desired high level.

The counter array can include a plurality of address decoders to recognize which column is to be selected based on a column address received from the sense amplifier array; a plurality of logic gates to bypass, based on a signal sent from the corresponding address decoder, the word line enable signal received from the sense amplifier array; and a plurality of registers each including an SRAM as a latch, the SRAM operating based on the word line enable signal provided from the logic gates.

For example, the address decoder, the logic gate and the register can be provided for each column. The memories can include SRAMs to form an SRAM-based global counter. The replica delay can include a plurality of delay lines to delay the judge clock and the precharge pulse signal by different delay amounts.

In another embodiment, an image sensor can include a pixel array including imaging pixels for sensing incident light to output pixel signals corresponding to the incident light; a counter array including a plurality of column address decoders and a plurality of memories, each column address decoder connectable to one of the plurality of memories based on a word line enable signal to output differential data signals; a sense amplifier circuit coupled to the global counter to sense and amplify the differential data signals based on judge clocks; and a replica delay circuit coupled to the sense amplifier circuit to delay clock signals to produce the judge clocks at timings determined based on the time it takes to ramp up the word line enable signal to a desired high level.

In another embodiment, a data readout apparatus may include: a counter array suitable for operating in response to a word line enable signal selected according to a column address; and a sense amplifier array suitable for delaying a judge clock and a precharge pulse signal using a replica delay, and reading data from the counter array.

In another embodiment, a CIS may include: a pixel array suitable for outputting pixel signals corresponding to incident light; a row decoder suitable for selecting and controlling a pixel within the pixel array at each row line; a data readout apparatus suitable for reading out the pixel signals outputted from the pixel array and outputting the read data; and a control unit suitable for controlling the operations of the row decoder and the data readout apparatus, wherein the data readout apparatus includes: a counter array suitable for operating in response to a word line enable signal selected according to a column address; and a sense amplifier array suitable for delaying a judge clock and a precharge pulse signal using a replica delay, and reading data from the counter array.

DETAILED DESCRIPTION

Figure 1:
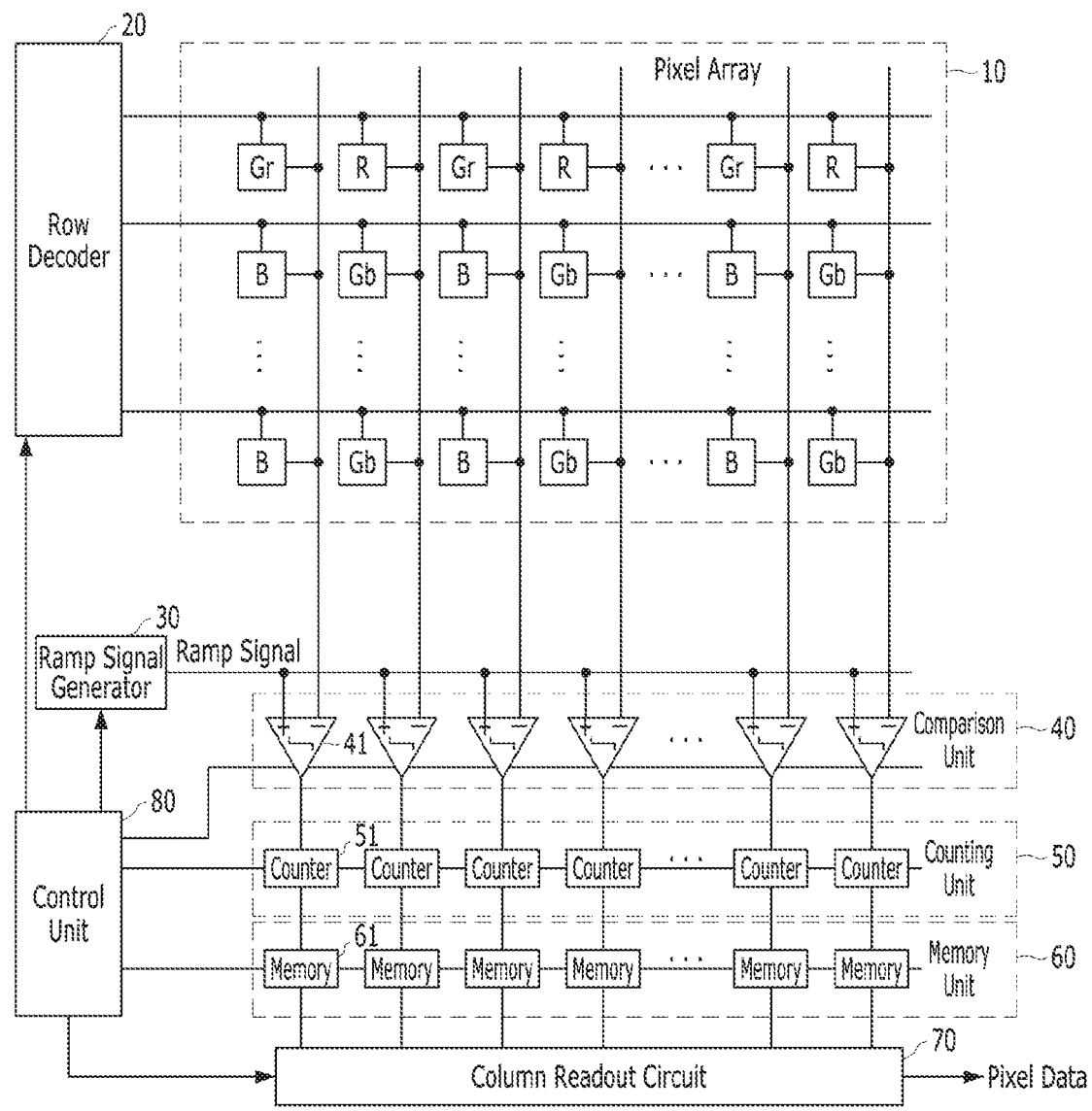
FIG. 1. illustrates an example of an image sensor implemented based on some embodiments of the disclosed technology.

Image sensors can be designed in certain ways to achieve desired performance. However, there can be conflicting considerations and trade-offs. For example, there is a trade-off between the high-speed readout and low power consumption. Thus, in order to facilitate the high-speed readout of large pixel array without consuming much power, various image sensor designs such as CIS designs use a column-parallel architecture to satisfy both high speed and low power requirements. The column-parallel architecture, together with the small pixel width of the current CIS pixel layout, can render the integration of analog-to-digital converters (ADCs) more difficult. For this reason, various image sensors are implemented by using single-slope ADCs with a simple structure.

When the ADCs convert analog signals into digital signals, a counter converts image data into a digital code by counting counter bits corresponding to the image data, for example, for one row time, and then transfers the digital code to a digital block at the rear stage of the ADCs. Here, the counter may be roughly divided into a local counter and a global counter. Some image sensors may be implemented by using the local counter only. Recently, however, TO other image sensors use the global counter to improve product competitiveness because the global counter occupies smaller space and consumes lesser power compared to the local counter. In particular, an SRAM-based global counter can bring even more benefits in terms of space efficiency.

Such an SRAM-based global counter has the following features. In general, most CISs, among other image sensors, use column-parallel single-slope ADCs to utilize their low-voltage, low-noise characteristics and relatively small footprint. The column-parallel single-slope ADC includes, among others, a ramp signal generator, a comparator, and a column counter. The column counter often includes a ripple counter at each column such that a correlated double sampling (CDS) or digital double sampling (DDS) operation is performed in the column. With the increase in user demand for high resolution, high speed image sensors, the clock speeds of the column counter have approached GHz ranges. Thus, the power noise of the column counter has become an important factor as it can have a negative impact on the image quality of the image sensors. Within this environment, a global-counter/hybrid-counter architecture has been introduced in an effort to improve the low-voltage, low-noise characteristics. However, since the global counter has no devices capable of processing signals in the columns, a large number of latches are needed, and thus the global counter will require more space for the latches. Thus, an SRAM-based global counter is the TO most promising candidate for the low-voltage, low-noise counter architecture since it uses SRAMs as latches. Furthermore, in a global counter architecture that includes registers at each several thousands of columns, those registers may be implemented using SRAM latches.

Since clock and control signals are fed in common to all columns, the global counter has a large capacitive load. Therefore, signals need to have a large timing margin to avoid signal overlapping. Furthermore, the global counter has a short readout time and needs to precharge global data lines for a limited time to read word lines of the SRAMs at non-overlap timing, which makes it difficult to create a large voltage swing after the precharge operation.

FIG. 1 illustrates an example of an image sensor implemented based on some embodiments of the disclosed technology, showing, as an example, a CMOS image sensor (CIS) with a column parallel architecture implemented using a general single-slope analog-to-digital converter.

As illustrated in FIG. 1, the image sensor implemented based on some embodiments of the disclosed technology may include a pixel array 10, a row decoder 20, a ramp signal generator 30, a comparison circuit 40, a counting circuit 50, a memory circuit 60, a control circuit 80, and a column readout circuit 70. In some embodiments of the disclosed technology, the image sensor can be semiconductor photosensors formed a substrate such as a CIS using a column parallel architecture. The image sensor may include an imaging sensor array of imaging pixels used to convert received incident light onto different imaging pixels into electrical charges or signals to represent images carried in the incident light. The pixel array 10 may output pixel signals corresponding to incident light. The row decoder 20 may select a pixel within the pixel array 10 at each row line and control an operation of the selected pixel based on control signals provided by the control circuit 80. The ramp signal generator 30 may generate a ramp signal based on control signals provided by the control circuit 80. In some embodiments of the disclosed technology, the ramp signal generated by the ramp signal generator 30 a signal that ramps up or down (e.g., saw-tooth signal) to be compared with the pixel signals. The comparison circuit 40 may compare the value of the ramp signal applied from the ramp signal generator 30 to the values of the pixel signals outputted from the pixel array 10 based on control signals of the control circuit 80. The counting circuit 50 may count up with each clock pulse applied from the control circuit 80 based on output signals from the comparison circuit 40. For example, the ramp signal is compared with the pixel signal by the comparison circuit 40, and the counting circuit 50 will continue counting until a certain event occurs (e.g., until a ramping-up signal exceeds the pixel signal, or until the pixel signal exceeds a ramping-down ramp signal). The memory circuit 60 may store the count provided by the counting circuit 50 based on control signals of the control circuit 80. The control circuit 80 may control the operations of the row decoder 20, the ramp signal generator 30, the comparison circuit 40, the counting circuit 50, the memory circuit 60, and the column readout circuit 70. The column readout circuit 70 may sequentially output the data of the memory circuit 60 as pixel data PXDATA based on control signals of the control circuit 80.

The image sensor (e.g., CIS) can remove an undesired offset by comparing a pixel signal (pixel output voltage) measured before light is incident onto the image sensor with a pixel signal measured after light is incident onto the image sensor. Such a technique may be referred to as correlated double sampling (CDS). The CDS may be performed by the comparison circuit 40.

In some embodiments of the disclosed technology, the comparison circuit 40 may include a plurality of comparators, the counting circuit 50 may include a plurality of counters, and the memory circuit 60 may include a plurality of memories. That is, each column has its own comparator, counter, and memory.

Referring to FIG. 1, the comparator, counter and memory may operate as follows.

A first comparator 41 may receive a pixel signal outputted from a first column of the pixel array 10 through a terminal coupled thereto and receive a ramp signal applied from the ramp signal generator 30 through the other terminal coupled thereto. The first comparator 41 may compare the values of the two signals based on a control signal from the control circuit 80 and output a comparison signal indicating which signal, between the pixel signal and the ramp signal, is larger.

Since the ramp signal $V_{RAMP}$ has a voltage level that increases or decreases to a predetermined magnitude over time after initialization, the values of the two signals inputted to the respective terminals of the comparator may coincide with each other at a certain point in time. After this point in time, the value of the comparison signal outputted from the comparator is inverted.

Therefore, based on the clock pulses provided by the control circuit 80, a first counter 51 may count up with each clock pulse from a point in time when the ramp signal starts to fall until after a point in time when the comparison signal outputted from the comparator 41 is inverted, and may output the counter value. The counter may be reset based on a reset control signal from the control circuit 80.

A first memory 61 may store the counter value received from the counter 51 and output the stored count value to the column readout circuit 70, based on a load control signal from the control circuit 80.

In some embodiments of the disclosed technology, the image sensor may reset the counter 51 using a reset signal (reset voltage) and then convert an image signal (signal voltage) into digital signals using the counter 51.

FIG. 1 illustrates an image sensor including a local counter. As another example, however, the image sensor may be implemented using a global counter architecture. For example, the image sensor may be implemented using a global counter architecture in which logic circuits are provided at each counter shown in FIG. 1 and a global counter coupled in common to the logic circuits. Here, a code outputted from the global counter may be transferred to the logic circuits of the respective columns in common.

Figure 2:
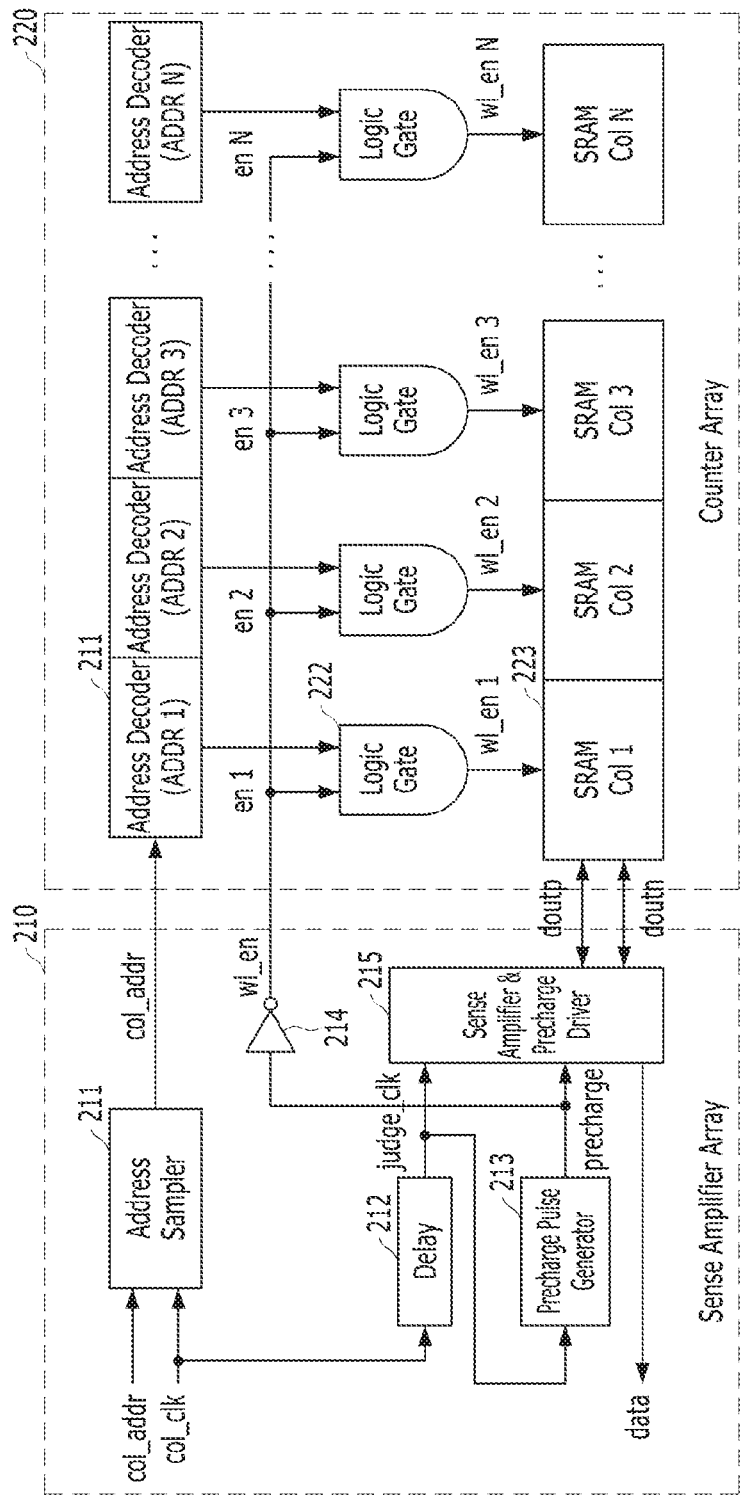
FIG. 2 is a configuration diagram of an example of a data readout apparatus using an SRAM-based global counter implemented based on some embodiments of the disclosed technology.

FIG. 2 is an example of a data readout apparatus using an SRAM-based global counter implemented based on some embodiments of the disclosed technology illustrating a sense amplifier array 210 reads data from a counter array 220.

The sense amplifier array 210 may include an address sampler 211, a delay 212, a precharge pulse generator 213, an inverter 214, and a sense amplifier and precharge driver 215. The address sampler 211 may receive a column address col_addr and a column clock col_clk applied from a digital timing generator (not illustrated). The address sampler 211 may be used to capture and store the column address to be transmitted to the counter array 220. For example, the address sampler 211 may sample the column address and transfer the sampled column address to address decoders 221 of the counter array 220. The delay 212 may receive the column clock col_clk applied from the digital timing generator (not illustrated), and may generate a judge clock judge_clk. For example, the delay 212 may generate the judge clock judge_clk by delaying a certain amount to output the judge clock judge_clk at desired timings. The precharge pulse generator 213 may receive the judge clock judge_clk generated by the delay 212 to generate a precharge pulse signal based on the judge clock judge_clk. The inverter 214 may invert the precharge pulse signal generated by the precharge pulse generator 213 and transfer the inverted precharge pulse signal as a word line enable signal wl_en to logic gates 222 of the counter array 220. The sense amplifier and precharge driver 215 may receive the judge clock judge_clk generated by the delay 212 and the precharge pulse signal generated by the precharge pulse generator 213. The sense amplifier array 215 is structured to reset differential data lines and sense low power signals of differential data doutp and doutn from the differential data lines and amplify the small voltage swing to recognizable logic levels so the differential data signals doutp and doutn inputted from registers (SRAMs) 223 of the counter array 220 can be interpreted properly.

The counter array 220 may include the plurality of address decoders 221, the plurality of logic gates 222, and the plurality of registers 223. Each of the address decoders 221 may be used to recognize which column is to be selected based on the column address col_addr received from the address sampler 211 of the sense amplifier array 210. Each of the logic gates 222 may selectively bypass, based on a signal sent from the corresponding address decoder 221, the word line enable signal wl_en for an SRAM (as further shown in FIG. 3) received from the inverter 214 of the sense amplifier array 210. Each of the registers 223 may use, as a latch, an SRAM operating based on the word line enable signal provided from the corresponding logic gate 222. Here, the address decoders 221, the logic gates 222 and the registers 223 may be provided for each column. For example, each column includes the address decoders 221, the logic gates 222, and the registers 223.

It is described that the above-described data readout apparatus of FIG. 2 uses the address decoding method, but the data readout apparatus may be implemented using shift registers.

Since the logic gates 222 within the counter array 220 may also operate in a write operation, the configuration of the logic gates 222 may become complex, thereby causing a delay.

Figure 3:
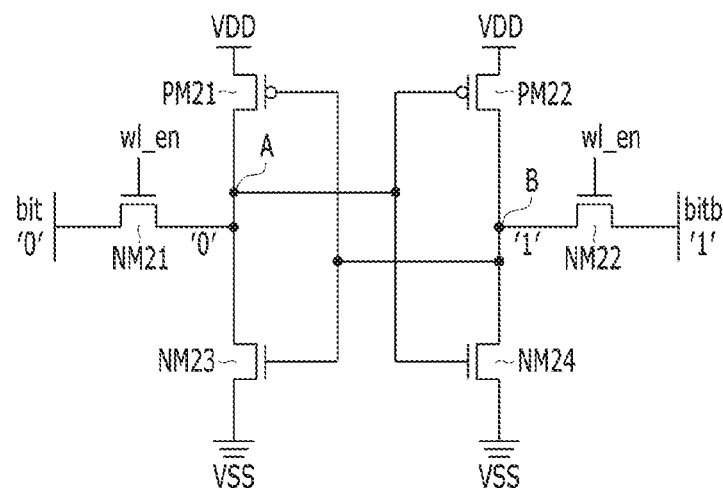
FIG. 3 is a circuit diagram of an example of SRAM cell implemented based on some embodiments of the disclosed technology.

FIG. 3 is a circuit diagram of an example of SRAM cell implemented based on some embodiments of the disclosed technology. Here, the SRAM shown in FIG. 2 may be used as the SRAM cell.

The SRAM cell may include a PMOS transistor PM21, a PMOS transistor PM22, an NMOS transistor NM21, an NMOS transistor NM22, a first cell node A, a second cell node B, an NMOS transistor NM23, and an NMOS transistor NM24. Here, the cell nodes may be referred to as storage nodes. The PMOS transistor PM21 may have a source terminal structured to receive a power supply voltage VDD. The PMOS transistor PM22 may have a source terminal structured to receive the power supply voltage VDD. The NMOS transistor NM21 may be coupled between a drain terminal of the PMOS transistor PM21 and a bit line and have a gate terminal structured to receive the word line enable signal. The NMOS transistor NM22 may be coupled between a drain terminal of the PMOS transistor PM22 and a bit line bar and have a gate terminal structured to receive the word line enable signal. The first cell node A may be coupled to the drain terminal of the PMOS transistor PM21 and the source terminal of the NMOS transistor NM21 in common. The second cell node B may be coupled to the drain terminal of the PMOS transistor PM22 and the source terminal of the NMOS transistor NM22 in common. The NMOS transistor NM23 may have a drain terminal coupled to the first cell node A, a gate terminal coupled to the second cell node B and the gate terminal of the PMOS transistor PM21 in common, and a source terminal structured to receive a ground voltage VSS. The NMOS transistor NM24 may have a drain terminal coupled to the second cell node B, a gate terminal coupled to the first cell node A and the gate terminal of the PMOS transistor PM22 in common, and a source terminal structured to receive the ground voltage VSS.

The SRAM cell may constitute a CMOS latch circuit including the two PMOS transistors PM21 and PM22, which are used to pull-up the bit line bar and bit line, respectively, and the two NMOS transistors NM23 and NM24, which are used to pull-down the bit line bar and bit line, respectively. Here, the CMOS latch circuit may form two cross-coupled inverters including the transistors PM21, PM22, NM23 and NM24.

In other words, an output node of a first inverter composed of the PMOS transistor PM21 and the NMOS transistor NM23 may be coupled to the first cell node A, and the first cell node A may be coupled to the bit line through the NMOS transistor NM21, which can be turned on by the word line enable signal.

On the other hand, an output node of a second inverter composed of the PMOS transistor PM22 and the NMOS transistor NM24 may be coupled to the second cell node B, and the second cell node B may be coupled to the bit line bar through the NMOS transistor NM22, which can be turned on by the word line enable signal.

Data read and write operations of the SRAM cell including six transistors may be performed through the bit line pair. During the data write operation, a data value is applied to the bit line and a complementary value to the data value is applied to the bit line bar. For example, provided that "0" value is applied to the bit line, "1" value is applied to the bit line bar, and "1" value may be then applied as the word line enable signal to turn on the two NMOS transistors NM21 and NM22 which perform a switching function. Then, the first and second inverter pair may be switched through the two NMOS transistors NM21 and NM22 which are turned on by the word line enable signal. That is, the first cell node A may be inverted from "1" to "0," and the second cell node B may be inverted from "0" to "1" as indicated in FIG. 3.

During the data read operation, the bit line and the bit line bar may be precharged with the same voltage during a precharge period, and "1" may be then applied as the word line enable signal during a sensing period. As a result, any one of the voltages of the bit line and the bit line bar may be changed by the values stored in the first cell node A and the second cell node B, causing a voltage difference between the bit line and the bit line bar. This voltage difference is detected as stored data.

Figure 4:
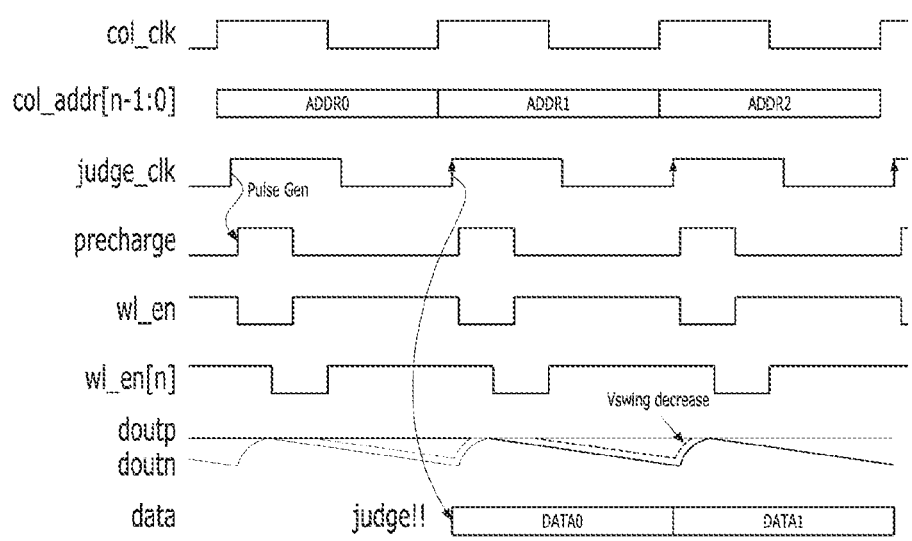
FIG. 4 is an example of a timing diagram of the data readout apparatus of FIG. 2.

FIG. 4 is an example of a timing diagram of the data readout apparatus of FIG. 2, illustrating that a noise margin of the sense amplifier is reduced due to the delay of the word line enable signal caused by the logic gate 222.

The column address col_addr may be sampled (captured) at a rising edge of the column clock col_clk and changed at each column dock col_clk. The judge clock judge_clk, the precharge pulse signal, and the word line enable signal may be generated by the delay 212, the precharge pulse generator 213, and the inverter 214. In an ideal situation, upon receipt of a high-level precharge pulse signal, the differential data lines may be all reset to a specific voltage (e.g., the power supply voltage VDD), and upon receipt of a low-level precharge pulse signal, the word line enable signal may transition to a high level, and the high-level word line enable signal allows the voltages of the differential data doutp and doutn to be retained or lowered by the data stored in the SRAM. The word line enable signal may be implemented using an inverted signal of the precharge pulse signal.

In reality, however, the transmission of the word line enable signal of the SRAM may be delayed by the logic gate 222, and thus a voltage difference between the differential data lines may be reduced. Such a reduction in voltage difference may degrade the noise margin or voltage swing margin of the sense amplifier. In the case of the SRAM where the sink current level is fixed due to the uncontrollable cell size of the SRAM, the time it takes to enable a word line may be more important than in the case of a general latch.

Therefore, an image sensor such as CIS including a counter using an SRAM implemented based on an embodiment of the disclosed technology can increase a noise margin of a sense amplifier using a replica delay. The CIS will be described in detail with reference to FIGS. 5 to 7.

Figure 5:
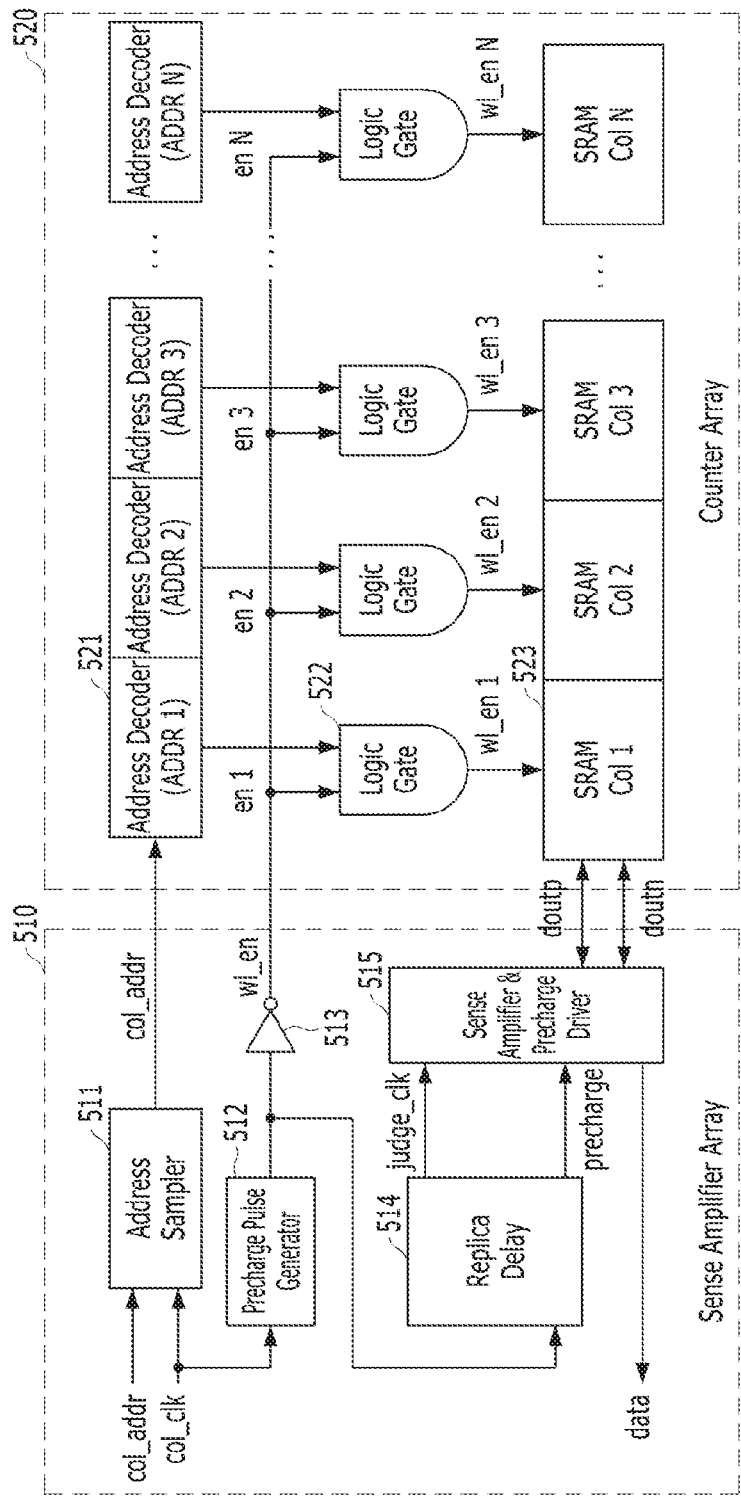
FIG. 5 is a configuration diagram of an example of a data readout apparatus implemented based on some embodiments of the disclosed technology.

FIG. 5 is a configuration diagram of an example of a data readout apparatus implemented based on some embodiments of the disclosed technology, illustrating a data readout apparatus using a replica delay to increase a noise margin of a sense amplifier.

The data readout apparatus implemented based on an embodiment of the disclosed technology may include a counter array 520 and a sense amplifier array 510. The counter array 520 may operate in response to a word line enable signal selected based on a column address col_addr. When reading data from the counter array 520, the sense amplifier array 510 may delay a judge clock judge_clk and a precharge pulse signal using a replica delay 514, in consideration of the time it takes to ramp up the word line enable signal to a high level. Here, the data readout apparatus may be implemented using an SRAM-based global counter.

The replica delay 514 may receive the judge clock and the precharge pulse signal and delay the judge clock and the precharge pulse signal by a preset time. For example, the delay amount of the replica delay 514 may be determined to compensate for time differences between the judge clock and the precharge pulse signal and the word line enable signal. The delay amount for the judge clock may be different from the delay amount for the word line enable signal. In some embodiments of the disclosed technology, the replica delay 514 may include a first delay line configured by replicating the delay of the column clock col_clk and a second delay line configured by replicating the delay in the circuit for generating the word line enable signal.

The sense amplifier array 510 may include an address sampler 511, a precharge pulse generator 512, an inverter 513, a replica delay 514, and a sense amplifier and precharge driver 515. The address sampler 511 may receive a column address col_addr and a column clock col_clk applied from a digital timing generator (not illustrated). The address sampler 511 may be used to capture and store the column address to be transmitted to the counter array 520. For example, the address sampler 511 may sample the column address and transfer the sampled column address to address decoders 521 of the counter array 520. The precharge pulse generator 512 may receive the column clock col_clk applied from the digital timing generator (not illustrated), and may generate a precharge pulse signal. The inverter 513 may invert the precharge pulse signal generated by the precharge pulse generator 512 and transfer the inverted precharge pulse signal as a word line enable signal to logic gates 522 of the counter array 520. In some embodiments of the disclosed technology, the replica delay 514 may receive the precharge pulse signal generated by the precharge pulse generator 512 and delay the judge clock judge_clk and the precharge pulse signal in consideration of the time it takes to ramp up the word line enable signal to a desired high level. The sense amplifier and precharge driver 515 may receive the judge clock judge_clk and the precharge pulse signal, which are delayed by the replica delay 514, sense and amplify differential data signals doutp and doutn inputted from registers (SRAMs) 523 of the counter array 520, and reset differential data lines. Here, the replica delay 514 may be implemented using a general delay method that uses a delay logic including components or circuits such as a buffer, NAND gate and NOR gate based on a modelling of an internal delay value.

The counter array 520 may include the plurality of address decoders 521, the plurality of logic gates 522 and the plurality of registers 523. Each of the address decoders 521 may be used to recognize which column is to be selected based on the column address col_addr received from the address sampler 511 of the sense amplifier array 510. Each of the logic gates 522 may selectively bypass, based on a signal from the corresponding address decoder 521, a word line enable signal for an SRAM received from the inverter 513 of the sense amplifier array 510. Each of the registers 523 may use, as a latch, an SRAM operating based on the word line enable signal provided from the corresponding logic gate 522. Here, the address decoder 521, the logic gate 522 and the register 523 may be provided for each column. For example, each column includes the address decoder 521, the logic gate 522, and the register 523.

The data readout apparatus implemented based on some embodiments of the disclosed technology may include the replica delay 514 in the sense amplifier array 510 and delay the judge clock judge_clk and the precharge pulse signal, which are required for the sense amplifier, based on the time it takes to ramp up the word line enable signal to a desired high level, thereby compensating for the delay of the word line enable signal caused by the logic gate 522 of the counter array 520.

Figure 6:
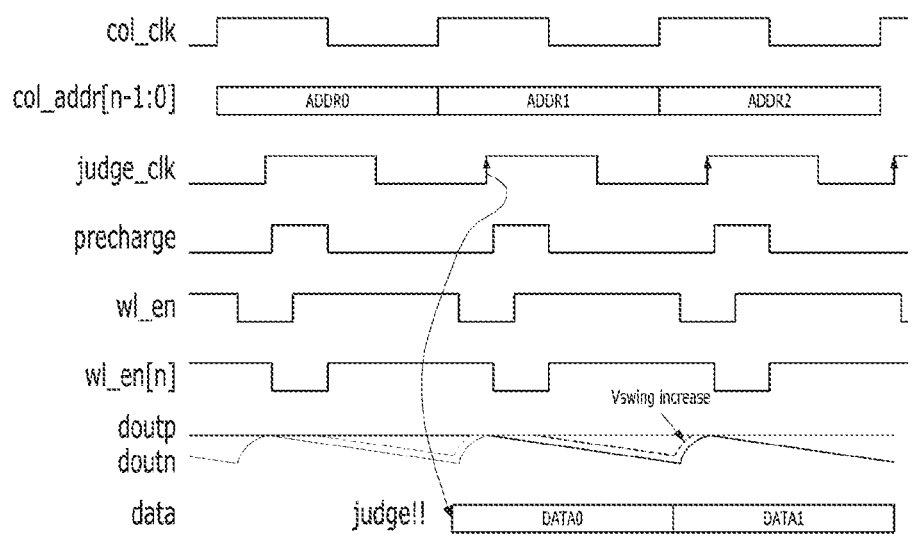
FIG. 6 is an example of a timing diagram of the data readout apparatus of FIG. 5.

FIG. 6 is an example of a timing diagram illustrating the operation of the data readout apparatus of FIG. 5, showing a noise margin of the sense amplifier, increased through the replica delay 514.

The column address col_addr may be sampled (captured) at a rising edge of the column clock col_clk, and changed at each column clock col_clk. The word line enable signal may be generated by the precharge pulse generator 512 and the inverter 513, and the judge clock judge_clk and the precharge pulse signal may be delayed by the replica delay 514.

The word line enable signal may have the same timing as FIG. 4, but the judge clock judge_clk and the precharge pulse signal may be delayed to increase the voltage swing margin.

Figure 7:
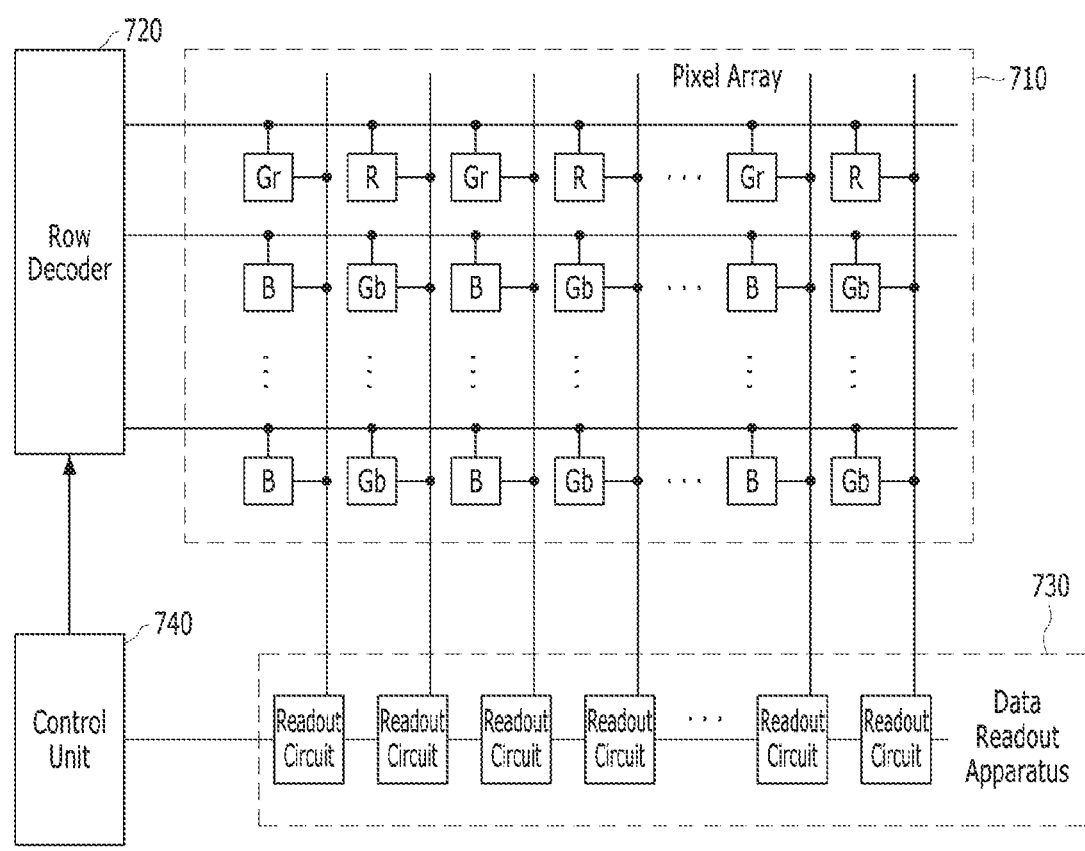
FIG. 7 is a configuration diagram of an example of an image sensor implemented based on some embodiments of the disclosed technology.

FIG. 7 is a configuration diagram of an example of an image sensor implemented based on some embodiments of the disclosed technology.

As illustrated in FIG. 7, the image sensor such as a CIS implemented based on some embodiments of the disclosed technology may include a pixel array 710, a row decoder 720, a data readout apparatus 730, and a control circuit 740. The pixel array 710 may output pixel signals corresponding to incident light. The row decoder 720 may select a pixel within the pixel array 710 at each row line and control an operation of the selected pixel based on control signals of a control circuit 740. The data readout apparatus 730 may read out the pixel signals from the pixel array 710 and output the read data, under control of the control circuit 740. The control circuit 740 may control the operations of the row decoder 720 and the data readout apparatus 730. The data readout apparatus 730 may be used as the data readout apparatus of FIG. 5 implemented based on some embodiments of the disclosed technology. Here, the data readout apparatus 730 may include the ramp signal generator, the comparison circuit, and others as described above with reference to FIG. 1.

In an embodiment of the disclosed technology, an image sensor includes a pixel array including imaging pixels for sensing incident light to output pixel signals corresponding to the incident light, a counter array including a plurality of column address decoders and a plurality of memories, each column address decoder connectable to one of the plurality of memories based on a word line enable signal to output data signals, a sense amplifier circuit coupled to the global counter to sense and amplify the data signals based on judge clocks, and a replica delay circuit coupled to the sense amplifier circuit to delay clock signals to produce the judge clocks at timings determined based on the time it takes to ramp up the word line enable signal to a desired high level.

The above-described data readout apparatus implemented based on some embodiments of the disclosed technology may be used for various types of large-scale SRAM arrays as well as the image sensors such as CIS.

In some embodiments of the disclosed technology, the data readout apparatus can increase the voltage swing margin or noise margin of the sense amplifier by using the replica delay during the read operation of the counter using the SRAM as the internal latch.

Furthermore, the data readout apparatus can support a high-speed operation of the image sensors such as CIS.

Although various embodiments have been described for illustrative purposes, it will be apparent to those skilled in the art that various changes and modifications may be made.

What is claimed is:

1. A data readout apparatus comprising:
   a comparison circuit, including an input port to receive an input signal and another input port to receive a ramp signal, structured to compare the input signal with the ramp signal to generate a comparison result;
   a counter array, including memories arranged based on each column address, structured to operate based on a word line enable signal, the counter array being coupled to the comparison circuit to receive the comparison results to count up with each clock pulse from a first timing determined in response to the word line enable signal until a second timing when the comparison result is changed to convert a counted number of clock pulses into differential data and output the differential data through differential data lines; and
   a sense amplifier array coupled to the differential data lines to reset the differential data lines based on a precharge pulse signal and to receive the differential data to sense and amplify the differential data based on a judge clock, the sense amplifier array including a replica delay structured to delay the judge clock and the precharge pulse signal based on a read out timing and read out the data from the counter array at the read out timing.

2. The data readout apparatus of claim 1, wherein the sense amplifier array comprises:
   an address sampler to receive a column address and a column clock applied from a digital timing generator, the address sampler sampling the column address and transferring the sampled column address to the counter array;
   a precharge pulse generator to receive the column clock applied from the digital timing generator and generate the precharge pulse signal;
   an inverter to invert the precharge pulse signal generated by the precharge pulse generator to transfer the inverted precharge pulse signal as the word line enable signal to the counter array; and
   a sense amplifier and precharge driver to receive the judge clock and the precharge pulse signal delayed by the replica delay to sense and amplify the differential data inputted from the counter array, the sense amplifier and precharge driver being structured to reset differential data lines,
   wherein the replica delay is structured to receive the precharge pulse signal generated by the precharge pulse generator to delay the judge clock and the precharge pulse signal in consideration of the time it takes to ramp up the word line enable signal to a desired high level.

3. The data readout apparatus of claim 1, wherein the counter array comprises:
   a plurality of address decoders to recognize which column is to be selected based on a column address received from the sense amplifier array;
   a plurality of logic gates to bypass, based on a signal sent from the corresponding address decoder, the word line enable signal received from the sense amplifier array; and
   a plurality of registers each including an SRAM as a latch, the SRAM operating based on the word line enable signal provided from the logic gates.

4. The data readout apparatus of claim 3, wherein the address decoder, the logic gate, and the register are provided for each column.

5. The data readout apparatus of claim 1, wherein the memories include SRAMs to form an SRAM-based global counter.

6. The data readout apparatus of claim 1, wherein the replica delay comprises a plurality of delay lines to delay the judge clock and the precharge pulse signal by different delay amounts.

7. An image sensor comprising:
a pixel array including imaging pixels for sensing incident light to output pixel signals corresponding to the incident light;
a row decoder to select and control the imaging pixels within the pixel array at each row line;
a data readout apparatus to read out the pixel signals outputted from the pixel array and output data; and
a control circuit to control the operations of the row decoder and the data readout apparatus,
wherein the data readout apparatus comprises:
a comparison circuit including an input port to receive a pixel signal and another input port to receive a ramp signal to compare the pixel signal with the ramp signal with and generate a comparison result;
a counter array including memories arranged based on each column address and structured to operate based on a word line enable signal, the counter array being coupled to the comparison circuit to receive the comparison results to count up with each clock pulse from a first timing determined in response to the word line enable signal until a second timing when the comparison result is changed to convert a counted number of clock pulses into the data; and
a sense amplifier array coupled to the differential data lines to reset the differential data lines based on a precharge pulse signal and to receive the differential data to sense and amplify the differential data based on a judge clock the sense amplifier array including a replica delay structured to delay the judge clock and the precharge pulse signal based on a read out timing and read out the data from the counter array at the read out timing.

8. The image sensor of claim 7, wherein the sense amplifier array comprises:
an address sampler to receive a column address and a column dock applied from a digital timing generator, the address sampler sampling the column address and transferring the sampled column address to the counter array;
a precharge pulse generator to receive the column clock applied from the digital timing generator and generating a precharge pulse signal;
an inverter to invert the precharge pulse signal generated by the precharge pulse generator to transfer the inverted precharge pulse signal as the word line enable signal to the counter array; and
a sense amplifier and precharge driver to receive the judge clock and the precharge pulse signal delayed by the replica delay to sense and amplify differential data inputted from the counter array, the sense amplifier and precharge driver being structured to reset differential data lines,
wherein the replica delay is structured to receive the precharge pulse signal generated by the precharge pulse generator to delay the judge clock and the precharge pulse signal in consideration of the time it takes to ramp up the word line enable signal to a desired high level.

9. The image sensor of claim 7, wherein the counter array comprises:
a plurality of address decoders to recognize which column is to be selected based on a column address received from the sense amplifier array;
a plurality of logic gates to bypass, based on a signal sent from the corresponding address decoder, the word line enable signal received from the sense amplifier array; and
a plurality of registers each including an SRAM as a latch, the SRAM operating based on the word line enable signal provided from the logic gates.

10. The image sensor of claim 9, wherein the address decoder, the logic gate and the register are provided for each column.

11. The image sensor of claim 7, wherein the memories include SRAMs to form an SRAM-based global counter.

12. The image sensor of claim 7, wherein the replica delay comprises a plurality of delay lines to delay the judge clock and the precharge pulse signal by different delay amounts.

13. An image sensor comprising:
a pixel array including imaging pixels for sensing incident light to output pixel signals corresponding to the incident light;
a counter array including a plurality of column address decoders and a plurality of memories, each column address decoder connectable to one of the plurality of memories based on a word line enable signal to output differential data;
a sense amplifier circuit coupled to the global counter to sense and amplify the differential data based on judge clocks; and
a replica delay circuit coupled to the sense amplifier circuit to delay clock signals to produce the judge clocks at timings determined based on the time it takes to ramp up the word line enable signal to a desired high level.

14. The image sensor of claim 13, wherein the counter array further includes a plurality of logic gates to selectively enable the plurality of memories using the word line enable signal.

15. The image sensor of claim 14, further comprising a precharge pulse generator coupled to the plurality of logic gates to provide the word line enable signal to the plurality of logic gates.

16. The image sensor of claim 15, wherein the precharge pulse generator is structured to generate a precharge pulse signal to be used to reset output ports of the plurality of memories.

17. The image sensor of claim 14, wherein the plurality of memories includes SRAMs operating based on the word line enable signal provided from the logic gates.

18. The image sensor of claim 13, wherein the replica delay comprises a plurality of delay lines to delay the judge clock by different delay amounts.

* * * * *